United States Patent [19]

Franciosi

[11] Patent Number: 4,818,565
[45] Date of Patent: Apr. 4, 1989

[54] METHOD TO STABILIZE METAL CONTACTS ON MERCURY-CADMIUM-TELLURIDE ALLOYS

[75] Inventor: Alfonso Franciosi, Eden Prairie, Minn.

[73] Assignee: Regents of the University of Minnesota, Minneapolis, Minn.

[21] Appl. No.: 165,411

[22] Filed: Feb. 29, 1988

Related U.S. Application Data

[63] Continuation of Ser. No. 115,174, Oct. 30, 1987, abandoned.

[51] Int. Cl.$^4$ .............................................. B05D 5/12
[52] U.S. Cl. ........................................ 427/74; 427/75; 437/185; 437/190
[58] Field of Search ................ 427/74, 75; 437/185, 437/190, 194, 234

[56] References Cited

U.S. PATENT DOCUMENTS

| | | | |
|---|---|---|---|
| 3,254,276 | 5/1966 | Schwarz et al. | 437/234 |
| 3,858,306 | 1/1975 | Kloek et al. | 437/185 |
| 4,206,003 | 1/1980 | Koehler | 437/185 |
| 4,301,591 | 11/1981 | Withers | 437/185 |
| 4,439,912 | 4/1984 | Pollard et al. | 437/185 |
| 4,510,514 | 4/1985 | Camlibel et al. | 437/190 |
| 4,532,699 | 9/1985 | Bourdillot et al. | 437/185 |

OTHER PUBLICATIONS

A. Wall et al., *J. Vac. Sci. Technol.*, A5, 3193 (Sept./Oct. 1987).
A. Wall et al., *J. Vac. Sci. Technol.*, A5, 1535 (Jul./Aug. 1987).
A. Franciosi et al., *Physical Review B*, 32, 8100 (1985).
R. R. Daniels et al., *Appl. Phys. Lett.*, 42, 50 (1983).
P. W. Kruse in "Optical and Infrared Detectors," R. J. Keyes, ed., *Topics in Appl. Physics*, 19, Springer-Verlag, NY (1980), at pp. 7–8, 59–64.

*Primary Examiner*—Norman Morgenstern
*Assistant Examiner*—Mananne L. Padgett
*Attorney, Agent, or Firm*—Merchant, Gould, Smith, Edell, Welter & Schmidt

[57] ABSTRACT

A method of stabilizing metal contacts on a body of a mercury-cadmium-telluride alloy comprising depositing a layer of a rare earth element such as samarium or ytterbium on the surface of the alloy prior to depositing an overlayer of a contact metal such as aluminum on the layer of the rare earth element.

8 Claims, 3 Drawing Sheets

METHOD TO STABILIZE METAL CONTACTS ON MERCURY-CADMIUM-TELLURIDE ALLOYS

GRANT INFORMATION

This invention was made with the support of Grant No. N00014-84-K-0545, awarded by the Office of Naval Research. The Government has certain rights in the invention.

This is a continuation of application Ser. No. 115,174, filed Oct. 30, 1987, now abandoned.

BACKGROUND OF THE INVENTION

Very little is known about the interface chemistry of ternary semiconductor alloys. The data available on compound semiconductors can be extrapolated only in part to ternary alloys, where the interplay of two different kinds of chemical bonding can substantially change the character and stability of each bond with respect to those of the binary parent compounds. $Hg_{1-x}Cd_xTe$ ("MCT") is probably the ternary semiconductor most studied in recent years because of its widespread application for infrared detectors in the 8–14 $\mu m$ spectral range. See P. W. Kruse, "Optical and Infrared Detectors," in *Topics in Appl. Physics*, R. J. Keyes, et., Vol. 19, Springer-Verlag, New York, NY (1980), at page 7.

This material poses a number of intriguing fundamental and technological problems that only now are starting to be addressed. As a ternary semiconductor alloy formed from parent compounds of very different stability, this material easily undergoes composition variations. It has also been recently recognized that the interplay of ionicity and metallicity in the two kinds of chemical bonding that coexist in the matrix further weakens one bond (Hg-Te) relative to the other (Cd-Te), causing lattice, surface and interface instabilities in the alloy. For example, dramatic composition variations have been observed in $Hg_{1-x}Cd_xTe$ as a result of processes as diverse as mechanical damage, oxidation and metal deposition.

Simple metals such as aluminum and indium react with MCT to form tellurides, induce a severe mercury (Hg) depletion in the near-surface region and/or atomic interdiffusion into the semiconductor. The consequences can include unreproducible metallization parameters and reduced contact stability and reliability.

Therefore, there is a need for a method to fabricate reliable metal contacts on MCT semiconductor surfaces.

SUMMARY OF THE INVENTION

The present invention provides a method of stabilizing metal contacts on a body of a mercury-cadmium-telluride (MCT) alloy, comprising depositing a layer of a rare earth element on the surface of the alloy prior to depositing an overlayer of a contact metal on said layer of said rare earth element. It was unexpectedly found that the interlayer of the rare earth element was effective to prevent the deleterious interactions between the contact metal and the MCT alloy. For example, a single monolayer of ytterbium (Yb) or samarium (Sm) deposited on an $Hg_{0.78}Cd_{0.22}Te$ surface prior to deposition of an aluminum overlayer effectively inhibits both the reaction between aluminum and tellurium, as well as mercury depletion at the MCT surface.

Although not intending to be bound by any theory of action, it is believed that the observed effects will be general for rare earth elements (atomic numbers 58–71), due to the unexpectedly large alloy formation enthalpies associated with the rare earth layers. For example, for Yb, the Hg solution enthalpy was calculated to be −25.9 KCal/moL and the YbTe formation enthalpy was calculated to be −72 KCal/moL. The respective values for samarium (Sm) were found to be −41.3 KCal/moL and −74 KCal/moL. If these values are compared with the telluride formation enthalpy of a typical reactive "contact metal" such as aluminum or indium (−25.4 KCal and −19.1 KCal/moL of Te), respectively, it can be concluded that the reaction of MCT with Yb or Sm may be thermodynamically favored relative to reaction with Al. Therefore, the predeposition of a thin, preferably monolayer (ML) of Yb or Sm can act to stabilize the MCT surface against further reaction with a "contact metal" such as Al or Cr, and control the stoichiometry of the interface region during contact formation.

DETAILED DESCRIPTION OF THE INVENTION

Mercury-cadmium-telleride alloys for use in the present method include those of the general formula: $Hg_{1-x}Cd_xTe$. $Hg_{1-x}Cd_xTe$ (MCT) is a semiconductor alloy with a band gap spanning the range of 0–1.5 eV as x is varied from 0 to 1. Preferred MCT alloys are those which are useful for infrared photodetection. Two specific alloys of interest can be represented by the formula $Hg_{1-x}Cd_xTe$, wherein (a) x is about 0.22±0.05, preferably ±0.01; and (b) wherein x is about 0.33±0.05. These alloys are useful in the 8–12 $\mu m$ and 3–5 $\mu m$ infrared atmospheric transmission windows at about 77K. Bulk single crystals of $Hg_{0.78}Cd_{0.22}Te$ (p type) are commerically available from Cominco Ltd., Trail, British Columbia, Canada, with faces perpendicular to the (110) direction.

Useful "contact metals" include any of the metals which can be used to form an electrical contact with the MCT surface and which exhibit a substantially lower metal telluride formation enthalpy than do the rare earth elements. Therefore, useful "simple metals" include aluminum, gallium and indium, while useful transition metals include chromium, molybdenum and tantalum.

Rare earth elements which can be used as interlayers include those which can be thermally-evaporated onto the MCT surface. Preferred rare earth elements for use in the present method include samarium, ytterbium, neodymium, gadolinium, europium and thulium, most preferably Sm or Yb.

The invention will be further described by reference to the following detailed examples.

EXAMPLE 1

Aluminum Deposition on Ytterbium Interlayer

Figure 1:
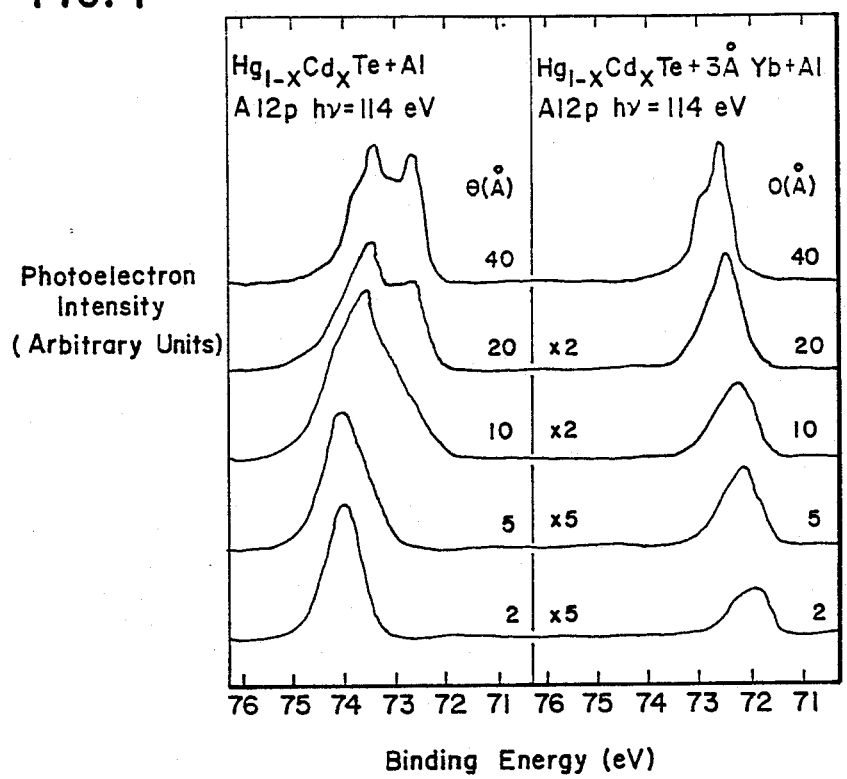
FIG. 1 is a graphic depiction of the high resolution energy distribution curves (EDCs) for the aluminum (Al) 2p core emission as a function of Al coverage ($\theta$) with (right) and without (left) a 3 Å Yb interlayer. The vertical bars mark the position of the Al 2p core level in metallic Al. (M. Cardona and L. Ley, eds., *Photoemission in Solids I: General Principles*, Springer-Verlag, Berlin (1978). All spectra have been approximately normalized to the peak intensity in order to emphasize lineshape changes. Binding energies are referred to the Fermi level $E_F$.
Figure 2:
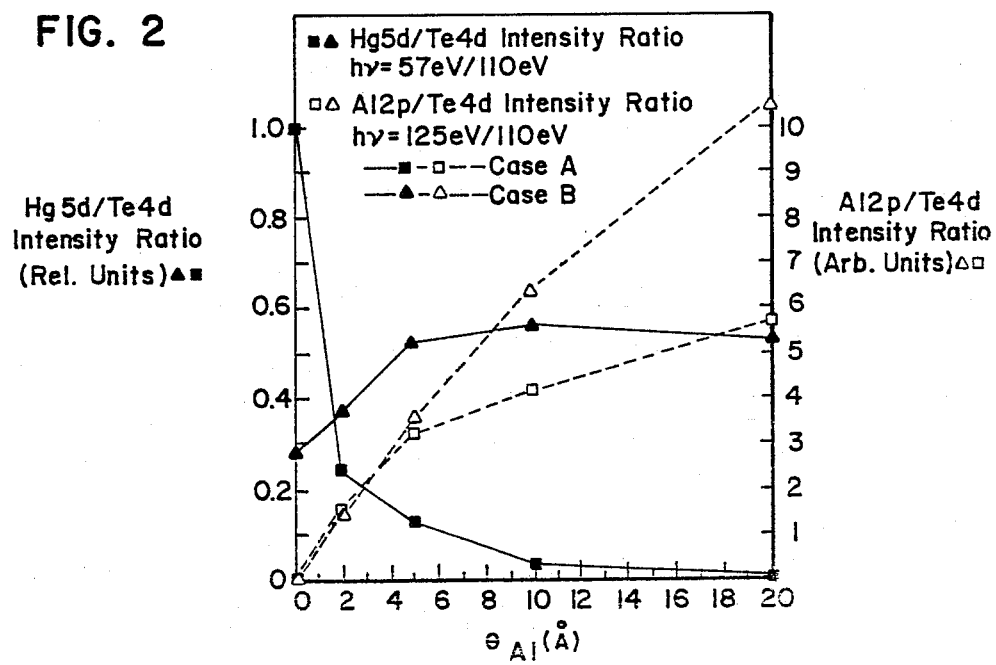
FIG. 2 is a graphic depiction of the Hg/Te (solid line) and Al/Te (dashed line) intensity ratios as derived from the integrated intensity of the Hg $5d_{5/2}$, Te 4d and Al 2p core levels shown as a function of Al coverage $\theta$. The squares (case A) mark the results in the absence of a Yb diffusion barrier, the triangles (case B) depict the results in the presence of a Yb monolayer at the interface.
Figure 3:
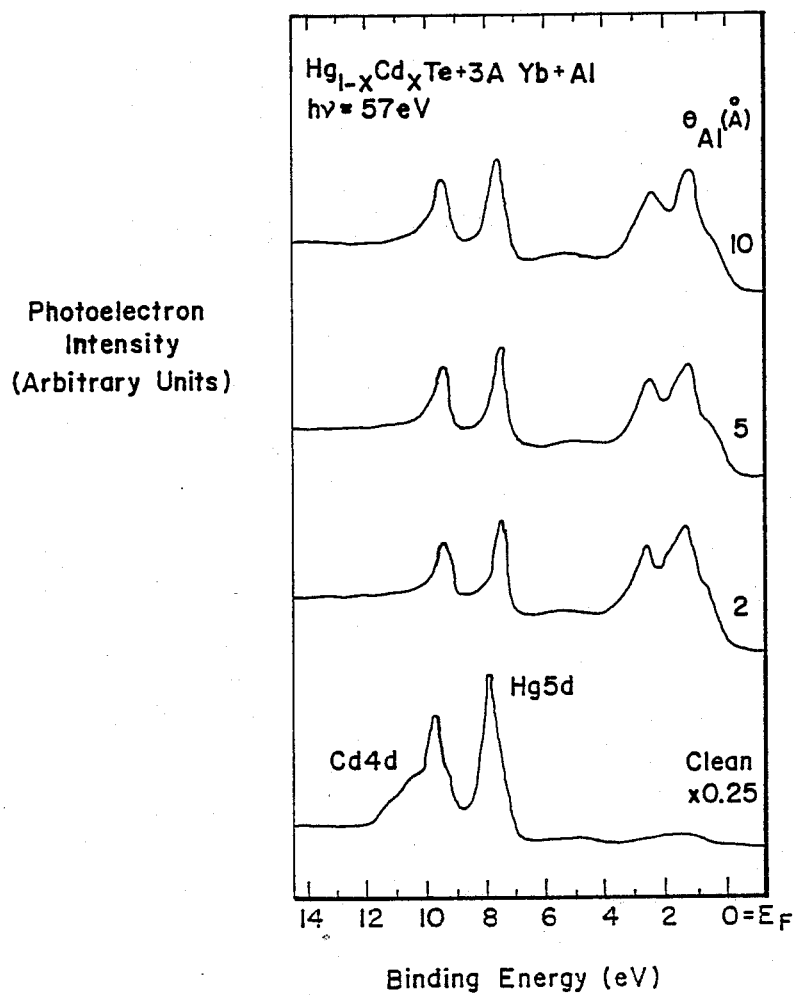
FIG. 3 is a graphic depiction of the EDCs for the valence band, Yb 4f (0–4eV), Hg 5d (8–10eV), and Cd 4d (10–11eV) emission from the $Hg_{1-x}Cd_xTe/Al$ interface in the presence of a 3 Å (=1 monolayer (ML))Yb interlayer, shown as a function of Al coverage $\theta$. The bottom-most EDCs correspond to emission from the clean $Hg_{1-x}Cd_xTe$ (110) surface.

The experiments were conducted on single crystals of $Hg_{0.78}Cd_{0.22}Te$ obtained from Cominco Inc. The crystals ($3 \times 3 \times 10$ mm in size) were cleaved in the photoelectron spectrometer at pressures in the $10^{-11}$ torr range. Metal overlayers were deposited in situ by direct sublimation from resistively heated sources with coverage monitored by a quartz thickness monitor. Synchrotron radiation from the 1 GeV electron storage ring at the Synchrotron Radiation Center of the University of Wisconsin, Madison, WI, was used to obtain angular integrated photoelectron Energy Distribution Curves (EDCs) of the valence band, Hg 5d, Cd 4d, Te 4d, Yb 5p and Al 2p core levels. Selected results are shown in FIGS. 1-3 with metal coverages given in angstroms. In terms of the surface density of atoms on the $Hg_{1-x}Cd_xTe$ (110) surface, 1 ML=$6.76 \times 10^{14}$ atoms/cm$^2$ corresponds to 1.12 Å of Al or 2.78 Å of Yb.

The left-most section of FIG. 1 depicts high resolution EDCs (overall resolution-electrons+photons of 0.15 eV) for the Al 2p core emission from the $Hg_{1-x}Cd_xTe$ (110)/Al interface as a function of Al coverage. The EDCs have been approximately normalized to the same peak height to emphasize lineshape changes. The vertical bar marks the position of the Al 2p core level in metallic Al. Only at the highest Al coverages explored does the Al 2p emission show a metallic Al component. At all coverages, high binding energy Al 2p contributions are related to Al-Te reacted species at the interface, and can be interpreted to be due to $Al_2Te_3$ formation. The high resolution employed allowed the identification of a number of Al-Te reacted features that were not resolved in earlier studies of the $Hg_{1-x}Cd_xTe/Al$ interface.

The right-most section of FIG. 1 depicts the effect of predeposition of a monolayer of Yb on the $Hg_{1-x}Cd_xTe$ surface prior to Al deposition. At all Al coverages, the Al 2p lineshape appears similar to the metallic Al 2p lineshape, with no evidence of Al-Te reacted components within the experimental uncertainty. A 0.4 eV shift to lower binding energy relative to the metallic position is observed at the lowest Al coverages and is related to Al-Yb interaction. Calculated solution enthalpies for Al atoms in Yb suggest that such an interaction is thermodynamically possible ($Hg_{sol}$ (Al:Yb)= $-29.8$ KJ/mol Al) and should correspond to a decrease in binding energy of 0.3 eV for the Al 2p core levels, as determined from a Born-Haber cycle calculation in the equivalent-core approximation.

The data given in FIG. 1 provide evidence that Yb monolayers act as diffusion barriers and prevent Al-telluride formation. Whenever Yb coverages below a monolayer were explored, the interlayer was found to be only partially effective in preventing Al-Te reaction.

The effect of Yb interlayer on the Hg concentration at the $Hg_{1-x}Cd_xTe/Al$ interfaces is depicted in FIGS. 2 and 3. In FIG. 3, EDCs for the valence band, Hg 5d (8-10 eV) and Cd 4d (10-11 eV) core emission from the $Hg_{1-x}Cd_xTe/Al$ interface in the presence of a 1 ML Yb interlayer are shown as a function of Al coverage. The bottom-most EDC corresponds to the clean surface emission prior to Yb deposition. Upon deposition of 3 Å of Yb, the characteristic $4f^{13}$ final state multiplet appears within 4 eV of the Fermi level $E_F$, the Hg 5d core emission intensity is at about 20% of the initial value, while the Cd intensity is reduced to about 1% of the clean surface value because of the very short Yb escape depth.

The effect of Al deposition is a slow attenuation of the Yb 4f and Hg 5d features without any evidence of Al-induced Hg-depletion of the interface. In FIG. 2, the Hg/Te (solid line) and Al/Te (dashed line) photoemission intensity ratios are shown as a function of Al coverage, as derived from the integrated intensity of the Hg $5d_{5/2}$, Te 4d and Al 2p core levels. Results are shown for the $Hg_{1-x}Cd_xTe/Al$ interface (squares, case A) and for a similar interface in the presence of an Yb monolayer diffusion barrier (triangles, case B). In the absence of a Yb interlayer (case A), a rapid decrease is observed in the Hg emission intensity and a shift to increasing binding energy of all semiconductor features reflecting a change in band bending. The Hg/Te ratio in FIG. 2 decreases to zero within experimental uncertainty at about 20 Å Al coverage. The Al/Te ratio increases slowly reflecting Al-Te reaction, island-growth of the metal overlayer and possible Te outdiffusion and segregation in the Al film.

In the presence of a Yb interlayer (case B), both Hg-depletion and Te outdiffusion are strongly reduced. The Hg/Te ratio at Al coverages above 10 Å shows an increase of over two orders of magnitude relative to the previous case. The Al/Te ratio increases initially (Al coverage below 2 Å) at an apparently similar rate. Al-Te interaction in case A and Al-Yb interaction in case B are responsible for this behavior. In the presence of the Yb interlayer, however, the Al/Te ratio increases rapidly toward high-coverage values that are approximately a factor of two higher than in case A. Possible changes in the island morphology of the Al overlayer and segregation phenomena have to be taken into consideration to account for the detail in the coverage-dependence of the Al 2p integrated intensity.

EXAMPLE 2

Samarium Deposition

Figure 4:
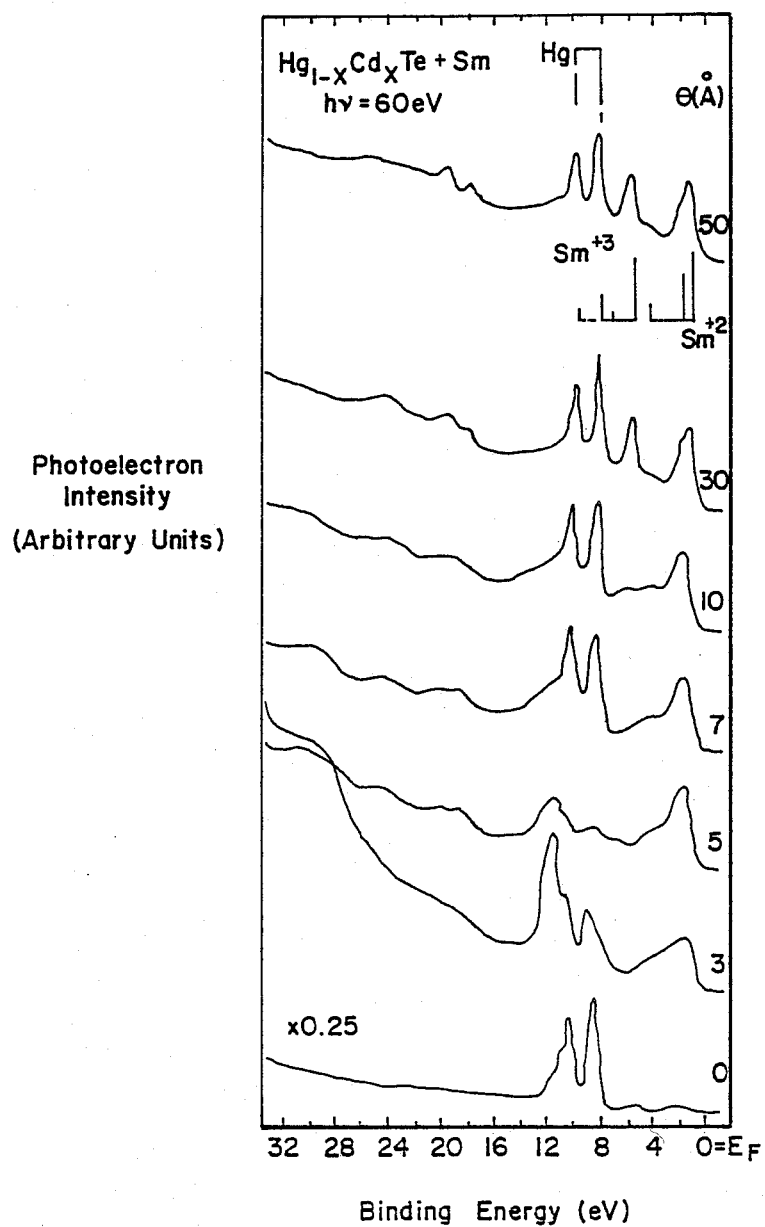
FIG. 4 is a graphic depiction of the valence-band emission from the $Sm/Hg_{1-x}Cd_xTe$ interface as a function of coverage in Å (1 ML=2.24 Å). In the top section of the figure ($\theta$=50 Å), the Hg 5d core contribution and the two Sm 4f final-state multiplets corresponding to divalent and trivalent Sm atoms are labeled.

The effect of Sm deposition onto an MCT surface prepared as described in Example 1 is depicted in FIG. 4, where coverages are given in Å, with 1 ML=2.24 Å. The energy range includes the Sm 5p core emission in the 17-27 eV energy range. In the top section of the figure, ($\theta$=50 Å), the vertical bars mark the position of the Hg 5d core contribution and the two Sm 4f final-state multiplets.

In the early stage of interface formation (below 6 Å), the interaction of divalent Sm with Te, which is thermodynamically favored, yields the formation of a Hg-depleted surface layer, the emergence of a new Te 4d doublet shifted 0.4–0.5 eV, and a rigid shift to high binding energy of the Hg and Cd core levels that might be related to a 0.1–0.3 eV increase in band bending or surface band gap.

The initial state of Sm/MCT interface formation is followed by a sharp transition to a second state ($\theta > 7$ Å) in which the Hg emission increases, and saturates at about 20% of the initial surface value. In this coverage range, trivalent Sm features are visible in the valence and core emission. The $Sm^{+3}$ 4f multiplet is clearly visible in the 5–10 eV binding energy range, and the line shape of the Sm 5p cores has evolved toward that characteristic of mixed valent Sm.

The data of FIG. 4, together with the coverage dependence of the core intensity and binding energies, suggest that the increase in Hg concentration is related to the formation of Sm-rich metallic phases with high solubility for Hg. These effects are similar to those observed for the deposition of Yb, and indicate that Sm would probably function similarly with respect to its ability to protect the MCT surface from an overlayer of contact metal. This nonmonotonic behavior of the local stoichiometry with Sm and Yb coverage is unprecedented in metal/semiconductor interface studies.

Conclusions

Table 1 lists the most stable telluride phases, the corresponding enthalpy of telluride formation, and the enthalpy of solution for Cd and Hg in a number of metal overlayers. For comparison, the second and third rows of the table also list the enthalpy of formation of HgTe and CdTe. Values are given for both the divalent and the trivalent form of the rare earths Sm and Yb, and are compared with those of the reactive overlayers In, Cr and Al.

TABLE 1

| | Thermodynamic Parameters Associated with MCT-Metal Interactions[1] | | | |
|---|---|---|---|---|
| Metal (M) | Most Stable Telluride[2] | $H_f$ Telluride (KJ/mol Te)[2] | $H_{sol}$ (Cd:M) (KJ/mol Cd)[3] | $H_{sol}$ (Hg:M) (KJ/ mol Hg)[3] |
| Hg | HgTe | −31.8 | — | — |
| Cd | CdTe | −101. | — | — |
| In | $In_2Te$ | −79.8 | +1.7 | −3.4 |
| Cr | — | — | +49.0 | +67.9 |
| Al | $Al_2Te_3$ | −106. | +14.7 | +17.2 |
| $Sm^{2+}$ | SmTe* | −310. | — | — |
| $Sm^{3+}$ | $Sm_2Te_3$* | −265. | −141. | −173. |
| $Yb^{2+}$ | YbTe* | −314. | −74.1 | −108. |
| $Yb^{3+}$ | — | — | −140. | −172. |

[1]A. R. Miedema et al., Physica, 100, 1 (1980).
[2]K. C. Mills, Thermodynamic Data for Inorganic Sulphides, Selenides and Tellurides, Butterworths, London (1974).
[3]Heats of solution for isolated Cd and Hg atoms, respectively, in the metal overlayer.
*Yb appears only in the divalent form at the $Hg_{1-x}Cd_xTe$/Yb interface, while for Sm a divalent-mixed valent transition is observed at metal coverage of about 4–5Å.

For Yb, the Hg solution enthalpy is −108. KJ/mol Hg and the YbTe formation enthalpy is −314 KJ/mol Te. Likewise, the Hg solution enthalpy for $Sm^{+3}$ is −173 KJ/mol Hg and the SmTe formation enthalpy is −310 KJ/mol Te. If these values are compared with the telluride formation enthalpy and cation solution enthalpies of a typical "reactive" contact metal such as Al, it can be concluded that all of the interface reaction products between $Hg_{1-x}Cd_xTe$ and Yb or Sm should be thermodynamically stable relative to reaction of the MCT surface with Al.

In conclusion, the experiments disclosed hereinabove demonstrate that Yb interlayers at the $Hg_{1-x}Cd_xTe$ (110)/Al interface control atomic interdiffusion. The lack of Al-telluride-related Al 2p core features, the persistence of the Hg 5d signal at high Al coverages and the dramatic increase in the Hg/Te ratio provide evidence that a single Yb monolayer is effective to prevent Al-Te reaction, stabilize the Hg-concentration at the interface and reduce Te outdiffusion. Thermodynamic calculations suggest that other rare earth interlayers, particularly those of samarium (Sm), may act as effective diffusion barriers during the formation of contacts between $Hg_{1-x}Cd_xTe$ and Al, or other reactive metals.

The invention has been described with reference to various specific and preferred embodiments and techniques. However, it should be understood that many variations and modifications may be made while remaining within the spirit and scope of the invention.

What is claimed is:

1. A method of stabilizing metal contacts on a body of a mercury-cadmium-telluride alloy comprising depositing a layer of a rare earth element on the surface of the alloy prior to depositing an overlayer of a contact metal on said layer of said rare earth element.

2. The method of claim 1 wherein said mercury-cadmium-telluride alloy is of the formula $Hg_{1-x}Cd_xTe$, wherein x is about 0.22±0.05.

3. The method of claim 1 wherein said mercury-cadmium-telluride alloy is of the formula $Hg_{1-x}Cd_xTe$, wherein x is about 0.33±0.05.

4. The method of claim 1 wherein the contact metal is selected from the group consisting of aluminum, gallium and indium.

5. The method of claim 1 wherein the contact metal is selected from the group consisting of chromium, molybdenum and tantalum.

6. The method of claim 1 wherein the rare earth element is selected from the group consisting of samarium, ytterbium, neodymium, gadolinium, europium and thulium.

7. The method of claim 6 wherein the rare earth element is samarium or ytterbium.

8. The method of claim 1, further comprising depositing a layer of said contact metal on said layer of said rare earth element.

* * * * *

UNITED STATES PATENT AND TRADEMARK OFFICE
CERTIFICATE OF CORRECTION

PATENT NO. : 4,818,565

DATED : April 4, 1989

INVENTOR(S) : Alfonso Franciosi, et al.

It is certified that error appears in the above-identified patent and that said Letters Patent is hereby corrected as shown below:

On the title page after "Inventor: Alfonso Franciosi, Eden Prairie, Minn." insert --Douglas J. Peterman, Maryland Heights, Missouri--.

At Col. 2, line 42, for "emision" read --emission--.

At Col. 3, line 66, for "$(Hg_{sol}$" read --$(H_{sol}$--.

Signed and Sealed this

Fourteenth Day of November, 1989

*Attest:*

JEFFREY M. SAMUELS

*Attesting Officer*  *Acting Commissioner of Patents and Trademarks*